GATED TRANSISTOR SHOCK EXCITED SINUSOIDAL PULSE GENERATOR

Filed Feb. 24, 1965

INVENTOR.
CHARLES P. HALSTED

BY Paul W. Fish
AGENT

United States Patent Office 3,297,963

Patented Jan. 10, 1967

3,297,963
GATED TRANSISTOR SHOCK EXCITED SINUSOIDAL PULSE GENERATOR

Charles P. Halsted, Oreland, Pa., assignor to Burroughs Corporation, Detroit, Mich., a corporation of Michigan Filed Feb. 24, 1965, Ser. No. 434,897
8 Claims. (Cl. 331—117)

This invention relates to an LC oscillator and, more particularly, to a highly stable LC oscillator which utilizes transistorized input-output and feedback circuitry.

In several fields of electrical communication, for example, radar, it is necessary to produce a train of waveforms of substantially constant frequency and amplitude. Further, it is necessary to start and stop the generated wave train in synchronism with a predetermined condition, for example, a radar return.

LC type oscillators are well known in the art and are generally well adapted to the gated or start-stop mode of operation. However, because of the undesirable damping which is introduced by output circuitry, or utilization means, LC oscillators are generally considered undesirable for generating highly stable wave trains. Crystal controlled oscillators are likewise well known in the art and are generally well adapted to the gated mode of operation. However, while producing more stabilized wave trains, the use of a crystal controlled oscillator generally involves utilizing a circuit which is characterized by specially made, costly components and high power consumption.

Particularly, in applications where cost, weight, and power are of primary concern, it is desirable to combine the relative simplicity of an LC oscillator with simple, low power control, buffer and feedback circuitry to achieve a highly stable oscillator circuit which is essentially unaffected by variations in the parameters of the control and/or utilization circuits.

It is, therefore, the principal object of this invention to provide an improved, highly stable transistor controlled LC oscillator.

It is another object of the present invention to provide an improved, gated LC oscillator capable of producing a highly stable wave train.

It is a further object of the present invention to provide an improved, transistorized, pulse responsive LC oscillator capable of producing oscillations of substantially constant frequency and uniform amplitude for a preselected interval.

It is a still further object of the present invention to incorporate a simple, frequency selective feedback loop into a pulse responsive LC oscillator circuit to insure frequency and amplitude stability.

Applicant has achieved the above-listed and other desirable objects by employing, in combination, a tuned LC circuit which is normally flooded with current through a low impedance source, pulse responsive switching means for interrupting the flow of current through the tuned circuit to shock excite the tuned circuit into oscillation, high input impedance buffer amplifier means for extracting an output signal from the tuned circuit and adjustable feedback means for feeding essentially square waves of current to the oscillating tuned circuit.

The above-listed objects and other aspects of applicant's invention will be further explained in the following detailed description. For a more complete understanding of applicant's invention, reference may be had to the following detailed description in conjunction with the drawings in which.

Figure 1:
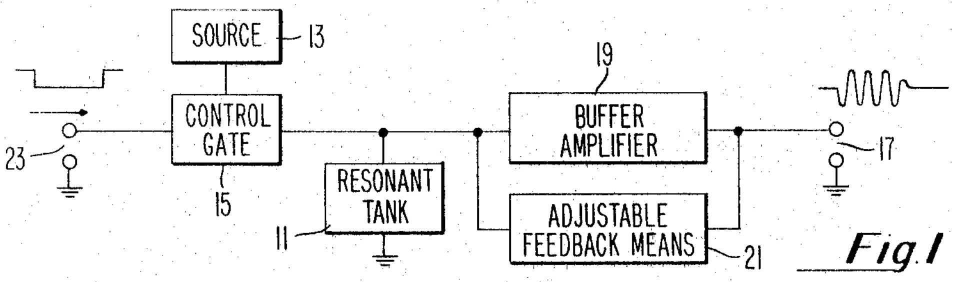
FIG. 1 illustrates in block diagram form an LC oscillator which is stabilized in accordance with applicant's invention.

Referring now to FIG. 1, there is shown a block diagram of a stabilized LC oscillator which embodies the principles of applicant's invention. The resonant tank 11 is normally connected in series across a potential source 13 and ground through control means 15. The output of the resonant tank is coupled to output terminals 17 via the buffer amplifier 19. Adjustable feedback means 21 is arranged to couple square waves of current to the resonant tank 11 during the operation of the oscillator. The resonant tank 11, as hereinafter to be more fully described, may comprise a parallel combination of an inductor L and capacitor C and, as is well known in the art, is designed to oscillate at a characteristic frequency determined by the following equation:

Equation 1

$$f=\frac{1}{2\pi\sqrt{LC}}$$

In operation, the inductor L of the resonant tank is normally flooded with current from the potential source 13. The oscillator circuit is gated "on" by a control pulse applied to input terminals 23. When an appropriate control signal is applied across input terminals 23, control means 15 interrupts the flow of current through the inductor L of the tank circuit whereupon the resonant tank begins to oscillate at its characteristic frequency given by Equation 1 above.

The output from the resonant tank is coupled through the high input impedance buffer amplifier 19 to the output terminals 17. In accordance with applicant's invention, the overall stability of the oscillator circuit is enhanced first by minimizing the loading or damping imposed across the tank circuit 11 by employing a high input impedance buffer amplifier to extract signals therefrom and, secondly, by employing adjustable feedback means 21 to feed square waves of current derived from the output signal of the buffer amplifier to the oscillating tank.

Figure 2:
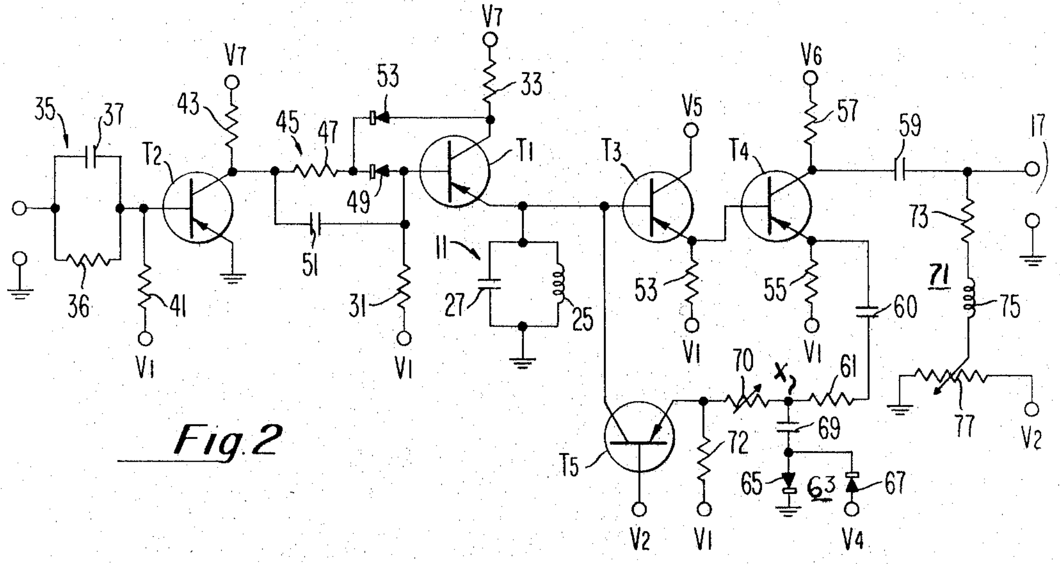
FIG. 2 is a schematic diagram of an LC oscillator embodying the principles of applicant's invention.

Referring now to FIG. 2, there is shown a schematic diagram of the preferred embodiment of applicant's stable transistor controlled LC oscillator. The parallel resonant tank comprises an inductor 25 and capacitor 27. The resonant tank is connected in series with transistor $T_1$ between a potential source $V_7$ and ground. A source of appropriate bias potential is applied via resistors 31 and 33 to the base and collector electrodes of transistor $T_1$ respectively. The bias is arranged such that transistor $T_1$ is normally conductive. With transistor $T_1$ biased into the normally conductive state, current normally flows from the source of potential through inductor 25 of the resonant tank.

Input terminals 23 are adapted to receieve and couple a control signal via coupling circuit 35, which includes resistor 36 and capacitor 37, to the base electrode of control transistor $T_2$. Appropriate sources of bias potential are coupled to the base and collector electrodes of transistor $T_2$ by resistors 41 and 43, respectively. The output of transistor $T_2$ is coupled to the base electrode of transistor $T_1$ via coupling circuit 45 which comprises resistor 47 and diode 49 in series therewith and capacitor 51 in parallel with the series circuit. An antisaturating diode 53 is coupled between the collector and base electrodes of transistor $T_1$ and is so poled as to insure the operation of transistor $T_1$ in the normal non-saturated region.

The output of the tank circuit, which is connected in the emitter circuit of transistor $T_1$, is directly coupled to the base of transistor $T_3$. Transistor $T_3$ is arranged in an emitter-follower configuration with bias supplied to the emitter electrode via resistor 53 while the collector electrode is directly connected to an appropriate potential source, for example, $V_5$. The output of transistor $T_3$ which is developed across the emitter resistor 53 is directly coupled to the base electrode of transistor $T_4$. Transistor $T_4$ comprises the second stage of the cascaded emitter follower buffer amplifier and has appropriate sources of bias potential, for example, $V_1$ and $V_6$, connected to the respective emitter and collector electrodes via resistors 55 and 57. The output of transistor $T_4$ is coupled to the output terminal 17 via capacitor 59. The output of transistor $T_4$, as shown, is developed across resistor 57 in the collector circuit. However, as would be evident to those skilled in the art, the output could equally well be taken across the resistor 55 in the emitter circuit.

A feedback signal developed across resistor 55 in the emitter circuit of transistor $T_4$ is coupled via capacitor 60 and resistor 61 to a symmetrical diode clipping circuit 63. The feedback signal developed across resistor 55 in the emitter circuit of transistor $T_4$ follows the sinusoidal wave form of the signals generated across the inductor during the oscillations of the tank circuit. The symmetrical diode clipping network 63 generates essentially square waves at point X in the feedback loop by clipping those portions of the peaks of the sine waves generated across resistor 55 which are above the biasing levels of the respective diodes of the clipping network. As illustrated in FIG. 2, the clipping network may comprise a pair of oppositely poled diodes 65 and 67. Unlike electrodes of diode 65 and 67 are connected to appropriate sources of potential, for example, ground and $V_4$, respectively, and a common junction of the other electrodes is coupled by capacitor 69 to the junction of resistors 61 and 70 of the feedback loop.

Adjustable feedback resistor 70 couples the clipped sine waves from point X in the feedback loop to the emitter electrode of transistor $T_5$. Transistor $T_5$ is arranged in a grounded, or common base configuration, with an appropriate source of bias potential, for example $V_2$, directly coupled to the base electrode. The collector electrode of transistor $T_5$ is directly coupled to the junction of the base electrode of transistor $T_3$, the emitter electrode of transistor $T_1$ and the normally ungrounded terminal of the resonant tank. As hereinafter to be more fully explained, the magnitude of the variable feedback resistor 70 determines the amplitude of the feedback signal and therefore governs the overall loop gain.

As illustrated in FIG. 2, a crossover or lead-lag network 71 may be utilized to couple the output of transistor $T_4$ to output terminals 17. As hereinabove stated, the choice of deriving an output signal from either the emitter or collector circuit of transistor $T_4$ is purely arbitrary and depends primarily upon the relative polarity of the initial wave form desired. As is known in the art, by employing an adjustable crossover or lead-lag network, the phase of the signal appearing across the output terminals 17 may be varied with respect to the output signal from transistor $T_4$. The crossover network 71 may comprise a serially connected resistor 73 and inductor 75 in combination with a potentiometer 77. The respective individual terminals of potentiometer 77 are connected across appropriate sources of potential and the resistor-inductor branch is connected between the movable contact of potentiometer 77 and the ungrounded output terminal 17. As is well known in the art, by selectively positioning the movable arm of potentiometer 77, the relative magnitude of the network resistance may be varied whereby the phase of the signal appearing across the output terminals 17 may be adjusted to lead the signal derived from the output transistor $T_4$ by an angle which is a function of the relative magnitudes of the network resistance and reactance, respectively.

In operation, the oscillator is turned off at pre-signal time, for example, pre-radar trigger time, by shunting the resonant tank circuit with the low output impedance of the emitter follower transistor $T_1$. The direct current which flows through inductor 25 when transistor $T_1$ is in the conductive state provides the energy required to start the LC oscillator. At radar trigger time transistor $T_1$ is switched off in response to the application of an input signal to the base electrode of transistor $T_2$, thereby shock exciting the resonant tank into oscillation. The potential at the emitter electrode of transistor $T_1$ does no drop abruptly when transistor $T_1$ is switched off because of a self-induced voltage in inductor 25. In response to the application of the control signal to the input terminals 23, transistor $T_2$ is rendered conductive and transistor $T_1$ is rendered non-conductive whereupon this induced voltage causes circulating currents to flow in resonant tank 11, charging capacitor 27. As is well known in the art, the voltage across inductor 25 will continue to follow a sinusoidal curve as the energy stored in the tank circuit 11 is continually exchanged between inductor 25 and capacitor 27. Further, as is well known in the art, the output of the cascaded emitter follower buffer amplifier follows the voltage across the inductor 25 as the energy stored in the tank is continually exchanged between the inductor and capacitor. Since the output coupling network including transistors $T_3$ and $T_4$ is such that there is no appreciable damping of resonant tank circuit 11, the oscillations will remain at the substantially constant amplitude level for several cycles.

The voltage amplitude, $e$, of the initial oscillation, which results when transistor $T_1$ is turned off in response to the application of a control signal to the input terminals 23, may be calculated from the following expression:

Equation 2

$$e = i_L \sqrt{L/C}$$

wherein $i_L$ is the value of direct current flowing through the inductor 25 immediately preceding the applicatiton of the control pulse across the input terminals 23. By employing applicant's stabilized transistor output buffer and feedback circuitry, the frequency of oscillation is primarily determined by the Equation 1 above and this frequency is substantially unaffected by variations in the parameters of the transistor amplifier and feedback circuits. Representative values for the circuit components schematically illustrated in FIG. 2 are listed hereinbelow in Table I. Calculations involving certain of these values will be discussed hereinbelow with respect to FIG. 4.

TABLE I

Transistors: all transistors are type 2N404.

Resistors, all resistors are ½ watt, ±5% of the indicated value in ohms:

$R_{31}$=6.8K
$R_{33}$=100
$R_{36}$=5.6K
$R_{41}$=130K
$R_{43}$=2K
$R_{47}$=2K
$R_{53}$=56K
$R_{55}$=2.4K
$R_{57}$=1.1K
$R_{61}$=2K
$R_{70}$=10K
$R_{72}$=30K
$R_{73}$=100
$R_{77}$=100

Capacitors, all capacitors are ±10% of indicated value in farads:

$C_{37}$=130$\mu\mu$
$C_{51}$=200$\mu\mu$
$C_{59}$=.01$\mu$ and
$C_{69}$=0.1$\mu$ Diodes, all diodes are defense standard 100029-3 germanium diodes.

Tank circuits, specification:

$L=60$ microhenries $\pm 10\%$
$Q=150 \pm 40\%$

Potential sources, all values in volts:

$V_1=+15$
$V_2=+3$
$V_3=$Ground
$V_4=-0.65$
$V_5=-3$
$V_6=-12.6$
$V_7=-15$

As hereinafter to be more fully described, the parallel combination of the input resistance of the cascaded emitter follower buffer amplifiers $T_3$ and $T_4$ and the collector resistance of the grounded base feedback amplifier $T_5$ must, in accordance with applicant's invention, be substantially higher than the anti-resonant reactance of the tank circuit to insure that the amplitude and frequency of the oscillator will be substantially independent of variations of the amplifier parameters. To insure that the input impedance of the amplifier is sufficiently high so as not to load the resonant tank, the cascaded emitter follower transistors $T_3$ and $T_4$ are employed to couple the output of the resonant tank to the output terminals 17. To further enhance the frequency and amplitude stability of the oscillator circuit, an output derived from the last stage of the emitter follower is fed to the symmetrical diode clipping network 63 which provides square waves of current via transistor $T_5$ to the resonating tank circuit. The amplitude stability of the oscillator is thus enhanced by feeding current which is in phase with the circulating current to the resonant tank to compensate for any resistive losses therein. Further, by employing a symmetrical diode clipping network in the feedback loop, the frequency stability of the oscillator is enhanced because the essentially square wave feedback signals, as is well known in the art, are rich in odd harmonic components whereas the even harmonic content of the feedback signals has been effectively eliminated. Thus, the nearest extraneous frequency has been moved to the third harmonic where, as is well known in the art, the impedance of the tuned circuit is lower and hence the amount of harmonic voltage generated is less.

Figure 3:
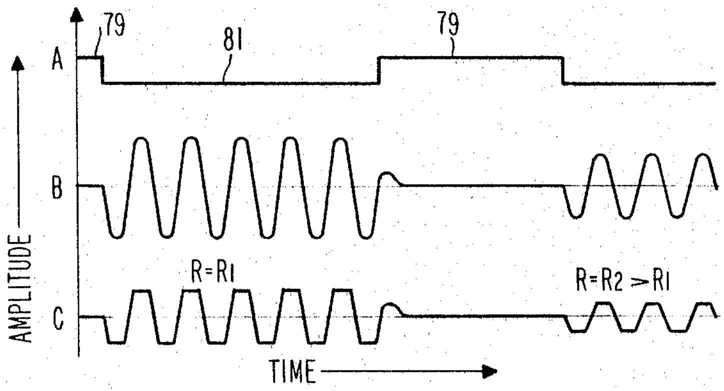
FIG. 3 is a series of waveforms which illustrate the operation of applicant's stabilized LC oscillator shown in FIG. 2.

Referring now to FIG. 3, there is shown a series of wave forms which further illustrate the operatiton of applicant's stable transistor controlled LC oscillator shown in FIG. 2. Waveform A comprises a square wave having an up-portion 79 during which transistor $T_2$ is held normally non-conductive and transistor $T_1$ is held normally conductive by the bias potential applied to the respective transistors and, as hereinbefore stated, the inductor 25 of the resonant tank is flooded with current through transistor $T_1$. The down-portion 81 of waveform A illustrates the time during which transistor $T_1$ is rendered non-conductive whereupon the current through inductor 25 is interrupted, thus shock exciting the parallel resonant tank into ascillation. Waveform B illustrates the voltage-time wave forms appearing at the ungrounded terminal of the resonant tank as the energy stored in the tank is continually exchanged between the inductor 25 and capacitor 27. The sinusoidal wave forms appearing at the ungrounded terminal of the resonant tank 11 are coupled, as hereinabove stated, via a high input impedance buffer amplifier to the output terminals 17 of the oscillator circuit. Thus, no appreciable damping of the tank circuit occurs, and therefore, the amplitude of the oscillations remains substantially constant for several cycles. At the termination of the negative or down-portion 81 of wave form A transistors $T_1$ and $T_2$ are rendered conductive and non-conductive, respectively, by their respective bias supplies and current again flows through transistor $T_1$ flooding tank 11, thereby rapidly damping the oscillations therein. The duration of the negative portion 81 of wave form A, as is well known in the art, would be selected to be equal to the desired duration of the generated wave train.

Waveform C of FIG. 3 illustrates the voltage-time wave forms appearing at junction X of the feedback resistors 61 and 70 in the feedback loop. As illustrated in FIG. C, with resistor 70 equal to a value $R_1$, a first amplitude square wave is developed which, as illustrated in a corresponding time in waveform B, results in a first amplitude output signal. By adjusting the setting of feedback resistor 70 to equal a value $R_2$, a second amplitude square wave is generated which, as illustrated at a corresponding time in waveform B, results in a second amplitude sine wave signal. As illustrated in waveform C of FIG. 3, when the resistance of feedback resistor 70 is increased to a value $R_2$, which is greater than $R_1$, the amplitude of the feedback signal is decreased and thus the magnitude of the feedback current, and consequently the loop gain is decreased.

Figure 4:
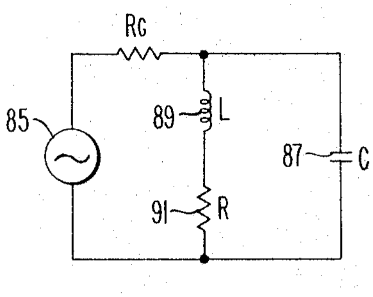
FIG. 4 illustrates the equivalent circuit of an oscillator having a parallel LC tank.

Referring now to FIG. 4, there is shown an equivalent circuit of an LC oscillator which may be utilized in designing and evaluating the stability of applicant's oscillator circuit as a function of variation in the circuit parameters. The equivalent circuit comprises an active source 85 having an internal impedance $R_G$ in series therewith and a tuned circuit including a capacitor 87 in parallel with a serially disposed inductor 89 and resistor 91.

The frequency of oscillation of the LC tank may be expressed in terms of the parameters of the equivalent circuit as:

Equation 3

$$f=\frac{1}{2\pi}\sqrt{\frac{1+R/R_g}{LC}}$$

wherein:

$R_G$ is the internal impedance of the active source
R is the total resistive component of the tuned circuit
L is the inductance of the tuned circuit, and
C is the capacitance of the tuned circuit.

Equation 3 above indicates that the frequency of oscillation of the circuit is a function of three variables, the LC product, R and $R_G$. The value of the LC product and R are determined by the manufacturing specifications for the resonant circuit and are generally unaffected by temperature variations. Therefore the variation of $R_G$ with temperature must be calculated to determine the primary effect of temperature on the stability of the oscillator circuit. The change in frequency of oscillation, $\Delta f$, which results from a change in value of the internal impedance, $\Delta R_g$, may be approximated by:

Equation 4

$$\Delta f=-\frac{Rf\Delta R_g}{2R_g^2}$$

This equation may be simplified by utilizing the definition of the quality factor, Q, which is commonly defined as:

Equation 5

$$Q=\frac{2\pi fL}{R}$$

Substituting Equation 5, i.e., the definition of the quality factor, Q, into Equation 4, the change in frequency, $\Delta f$, in response to a change in the internal impedance of the source, $\Delta R_g$, may be expressed as:

Equation 6

$$\Delta f=-\frac{\pi f^2 L\Delta R_g}{QR_g^2}$$

The internal impedance of the amplifier, $R_G$, in the case of the transistorized output circuitry, as shown in FIG. 2, comprises the parallel combination of the input resistance of the cascaded emitter follower transistor $T_3$ and $T_4$ and the collector resistance of the common base feedback amplifier transistor $T_5$.

The input resistance of the cascaded emitter followers may be calculated, as is known in the art, by first determining the input resistance of the second stage of the cascaded emitter followers, i.e., transistor $T_4$, and then utilizing this value in calculating the input resistance of the first stage of the cascaded emitter followers, i.e., $T_3$. Thus, referring to FIG. 2, the input resistance of transistor $T_4$ may be expresed as:

Equation 7

$$R_{in(T_4)}=\frac{R_{55}\times R_{61}(\beta+1)}{R_{55}+R_{61}}$$

Utilizing the component values indicated in Table I and assuming the worst case $\beta$ equal to 25, the input resistance of the second stage of the cascaded emitter followers may be expressed as:

Equation 8

$$R_{in(T_4)}=\frac{2.4K\Omega\times 2K\Omega\times 25}{2.4K\Omega+2K\Omega}=27.3K\Omega$$

Again, assuming the worst case $\beta$ equal to 25 and utilizing value for $R_{53}$ indicated in Table I, the minimum input resistance of the first stage of the cascaded emitter followers, i.e., $T_3$, may be expressed as:

Equation 9

$$R_{in(T_3)}=\frac{R_{in(T_4)}\times R_{53}\times(\beta+1)}{R_{in(T_4)}+R_{53}}=459K\Omega$$

The value of the collector resistance of many 2N404 transistors which were tested with .4 milliampere of collector current was in excess of 100K ohms.

Therefore, utilizing these values for the input resistance of the cascaded emitter followers $T_3$ and $T_4$ and the collector resistance of the grounded base amplifier $T_5$, the internal impedance $R_G$ of the amplifier may be expressed as:

Equation 10

$$R_g=\frac{R_{in(T_3)}\times r_{c(T_5)}}{R_{in(T_3)}+r_{c(T_5)}}=82K\Omega$$

Utilizing Equation 6 and the values of $R_G$ calculated above, the change in frequency $\Delta f$ may be expressed as a function of $\Delta R_g$ as:

Equation 11

$$\Delta f=\frac{-\pi f^2 L\Delta R_g}{Q(82\times 10^3\Omega)^2}$$

in a typical application, applicant's oscillator circuit may be utilized to generate ¼ mile range marker pulses in which case the oscillator frequency must be 323.44 kilocycles. A typical system specification would require a frequency stability of plus or minus .09%, i.e., ±291 cycles per second, for temperature variations ranging from 0 to +55° centigrade. Utilizing this frequency and permissible change in frequency and the values of Q and L listed in the hereinabove Table I, the tolerable change in internal impedance may be expressed by substituting these values into Equation 11 as:

Equation 12

$$\Delta R_g=\frac{\Delta f Q(82\times 10^3\Omega)^2}{\pi f^2 L}=9 \text{ meg. ohms}$$

Since the value of the tolerable change of internal impedance $\Delta R_g$, in the example calculation above, is over one hundred times the calculated value of the internal impedance $R_g$, the oscillator is well within the stability requirements of plus or minus .09% stipulated in the example problem. Although in reality the change in internal impedance, $\Delta R_g$, must take into account all cumulative changes of circuit component values as well as all variations in supply potentials, the tolerable change in the internal impedance indicates that for all practical applications the frequency of oscillation of the tuned circuit will be independent of expected variations of circuit parameters. The measured stability of a representative embodiment of applicant's oscillator circuit utilizing a resonant tank having the specifications indicated in Table I, as supplied by the F. W. Sickles Division of the General Instruments Corporation, was .03% for temperature variations ranging from 0 to +55 degrees centigrade.

It is to be understood that the foregoing explanation is by way of illustration only. As would be evident to those skilled in the art, applicant's invention may be adapted to fabricate stable LC oscillator circuits by considerably varying the actual component values from those indicated in Table I. Further, one skilled in the art could adapt the schematic shown in FIG. 2 to accommodate either NPN or PNP transistors merely by choosing the appropriate biasing potentials. Therefore, it is applicant's intention to be limited only as indicated by the scope of the following claims.

What is claimed is:

1. A gated pulse generating circuit comprising:
a parallel resonant tank circuit,
means for normally supplying current to said tank circuit,
pulse responsive means for periodically interrupting said supply of current to said tank circuit whereby the tank circuit is shock excited into oscillation,
output buffer means for extracting signals from said tank circuit, and
feedback means for supplying square waves of current to said tank circuit during oscillation.

2. A gated pulse generating circuit comprising:
a parallel inductor-capacitor tuned circuit,
first transistor means for normally supplying current to said tuned circuit,
second transistor means for interrupting the supply of current to said tuned circuit in response to the application of an input pulse, and thereby setting said tuned circuit into oscillation,
first circuit means including a transistorized high input impedance buffer amplifier for coupling signals from said tuned circuit to output terminal means, and
second circuit means for modifying signals tapped from the output of said amplifier and for feeding essentially square waves of current to said tuned circuit during oscillation.

3. The circuit of claim 2 wherein said first circuit means comprises a multi-stage cascaded emitter follower amplifier and wherein said second circuit means comprises a diode clamping network and a common base transistor amplifier driven by said diode clamping network, said common base amplifier having its collector electrode coupled to a common junction of the tuned circuit and the input of said cascaded emitter follower amplifier.

4. A gated oscillator circuit for generating discontinuous sinusoidal pulse trains comprising:
a parallel resonant tank circuit,
first circuit means for normally supplying current to said tank circuit,
pulse responsive means for periodically interrupting the supply of current to said tank circuit whereupon said tank circuit is shock excited into oscillation,
second circuit means including a high input impedance buffer amplifier for extracting signals from said resonant tank, and
adjustable feedback means including a common base transistor driven by a symmetrical diode clipping network for feeding essentially square waves of current to said tank circuit during oscillation.

5. The circuit of claim 4 wherein said first circuit means comprises:
a normally conductive transistor and wherein said resonant tank is connected in the emitter circuit of said normally conductive transistor.

6. An oscillator circuit for generating a discontinuous train of sinusoidal pulses in response to the application of space control pulses comprising:

a parallel resonant tuned circuit having a fundamental frequency of oscillation, pulse responsive switching means for normally delivering curent to said tuned circuit and for interrupting said current for a predetermined time upon receipt of said control pulses, buffer amplifier means including a pair of direct-coupled cascaded emitter followers for coupling signals from said tuned circuit to output terminal means, feedback means including a symmetrical diode clipping circuit and a grounded base amplifier for feeding signals rich in the fundamental and odd harmonics of said frequency from the last stage of said buffer amplifier to a common junction of said tuned circuit and the input of said buffer amplifier.

7. The oscillator circuit of claim 6 wherein said feedback means additionally includes adjustable resistor means for varying the amplitude of said feedback signals.

8. The circuit of claim 6 additionally including a crossover network coupled between the output of said buffer amplifier means and said output terminal means.

No references cited.

ROY LAKE, *Primary Examiner.*

S. H. GRIMM, *Assistant Examiner.*